(12) United States Patent
Lee

(10) Patent No.: US 6,926,544 B2
(45) Date of Patent: Aug. 9, 2005

(54) FLASH MEMORY APPARATUS HAVING SINGLE BODY TYPE ROTARY COVER

(75) Inventor: Jung-Woo Lee, Seoul (KR)

(73) Assignee: Hana Micron, Inc., Asan (KR)

(*) Notice: Subject to any disclaimer, the term of this patent is extended or adjusted under 35 U.S.C. 154(b) by 0 days.

(21) Appl. No.: 10/346,105

(22) Filed: Jan. 17, 2003

(65) Prior Publication Data
US 2003/0223286 A1 Dec. 4, 2003

(30) Foreign Application Priority Data
May 30, 2002 (KR) .................................. 20-2002-0016582

(51) Int. Cl.⁷ .............................................. H01R 13/44
(52) U.S. Cl. ...................................................... 439/147
(58) Field of Search ................................ 439/142, 143, 439/144, 136

(56) References Cited
U.S. PATENT DOCUMENTS
5,816,824 A * 10/1998 White et al. ................... 439/35
5,852,394 A * 12/1998 Watanabe et al. ............. 336/66
6,267,608 B1 * 7/2001 Yagi ............................. 439/142

* cited by examiner

Primary Examiner—Gary Paumen
Assistant Examiner—James R. Harvey
(74) Attorney, Agent, or Firm—Millen, White, Zelano & Branigan, P.C.

(57) ABSTRACT

A flash memory apparatus having a single body type rotary cover, wherein a cover is not completely separated from a main body so that loss of the cover is prevented. The flash memory apparatus includes: a flash memory main body including a rectangular shaped case within which a memory element is mounted. A USB terminal piece is electrically connected with the memory element and is installed at a front end of the case to project therefrom and a hinge protuberance formed on at least one side of the case. A cover defined by a pair of parallel plate members facing each other with an interval corresponding to the thickness of the case is provided. The cover has an open front end and a closed rear end. Both lateral ends of the cover are open. The parallel plate members have a pair of hinge holes joined to the hinge protuberance, so that the cover is rotatable with respect to the flash memory main body, whereby the USB terminal piece is either received in an inner space of the cover or rotated for exposure to the outside of the cover.

24 Claims, 4 Drawing Sheets

[FIG. 1a]
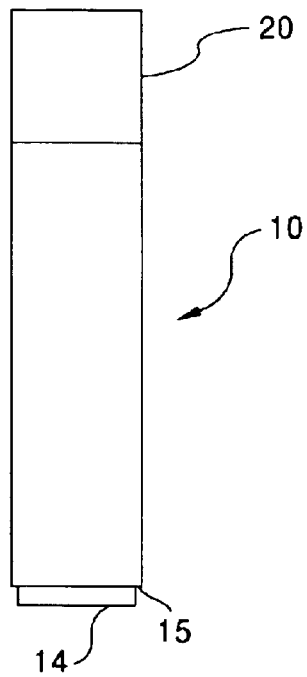
[FIG. 1b]
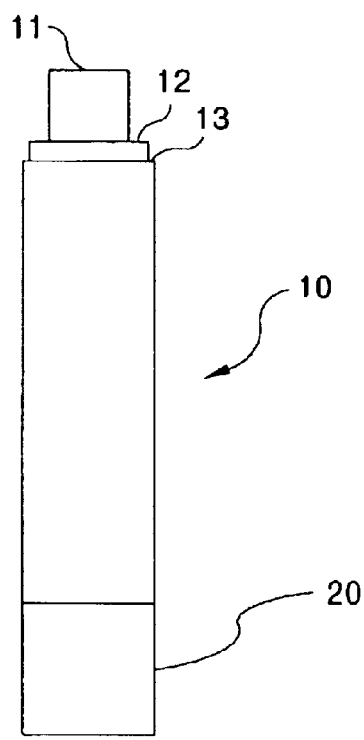

[FIG. 2]
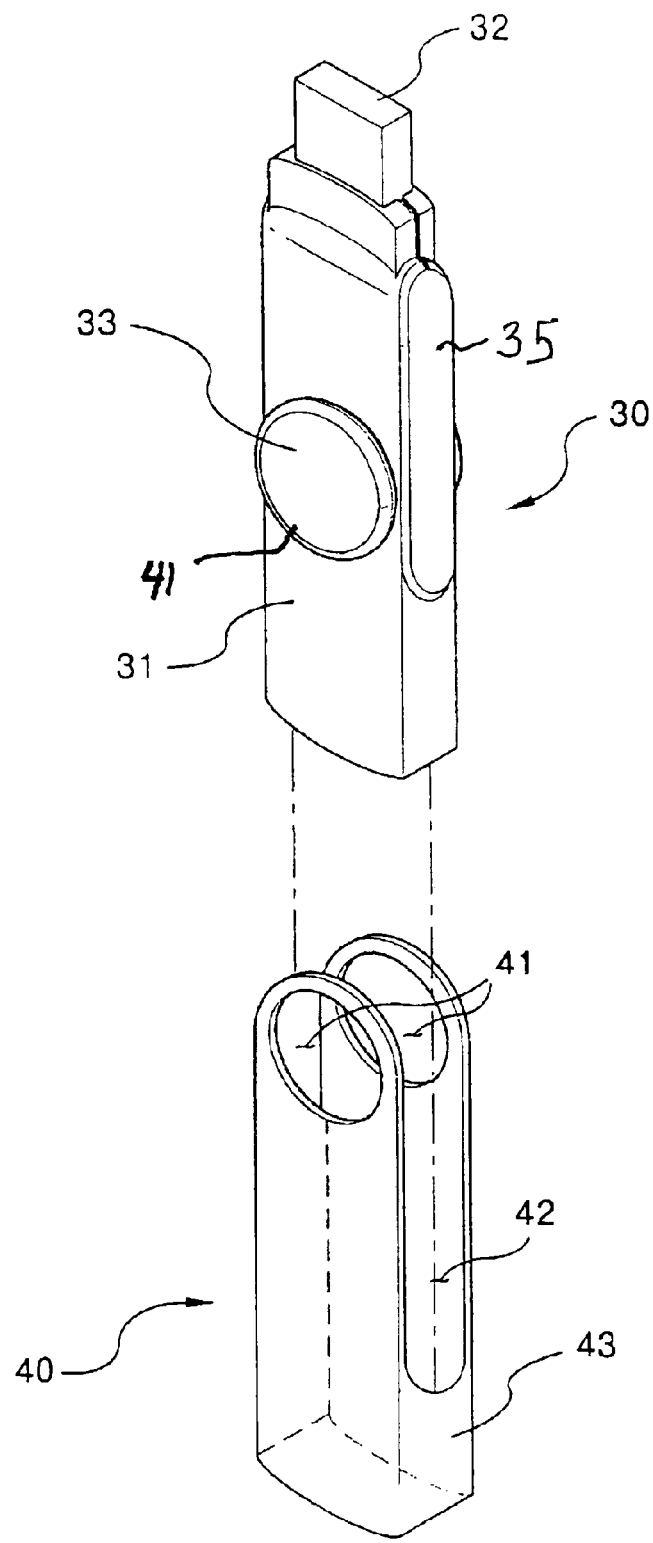

[FIG. 3a]
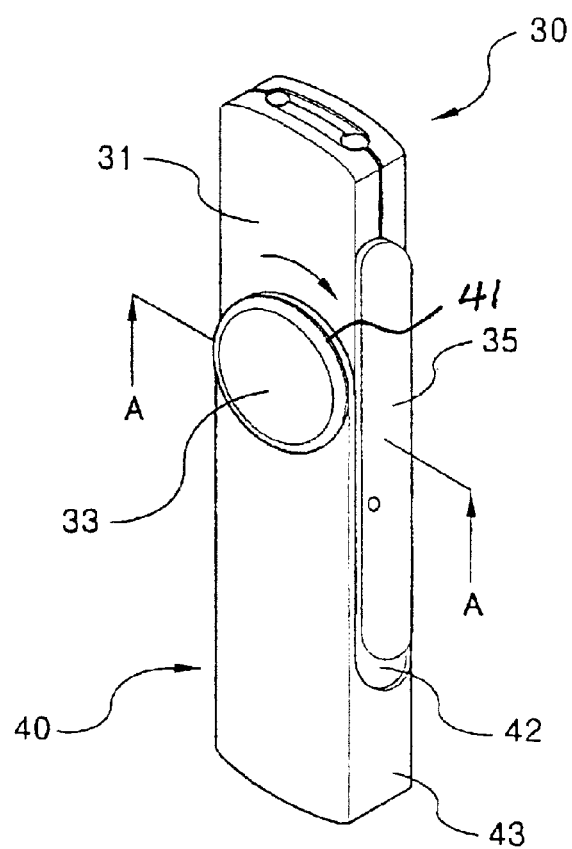

[FIG. 3b]
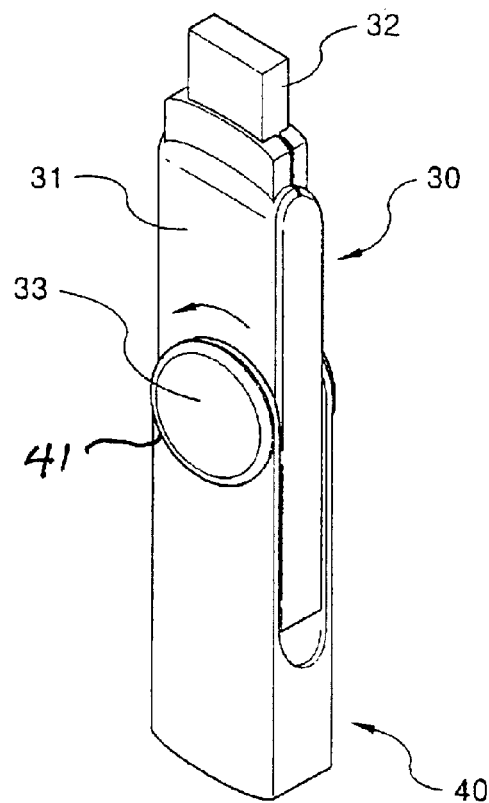
[FIG. 4]
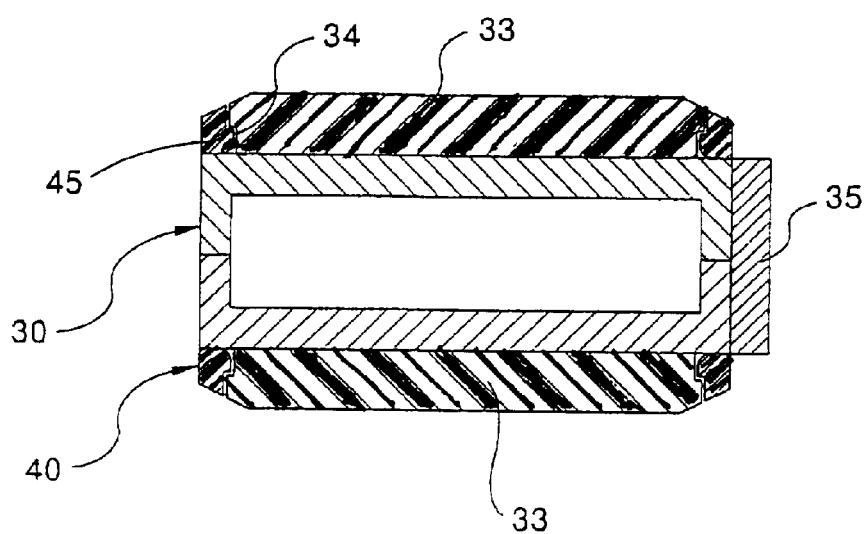

FLASH MEMORY APPARATUS HAVING SINGLE BODY TYPE ROTARY COVER

BACKGROUND OF THE INVENTION

1. Field of the Invention

The present invention relates to a flash memory apparatus, and more particularly to a flash memory apparatus, wherein a cover is not completely separated from the main body upon being in use so that lost of the cover is prevented.

2. Description of the Related Art

A flash memory is a nonvolatile semiconductor memory device also called as a flash RAM (Random Access Memory). The flash memory is also one of variations of an EEPROM (Electrically Erasable Programmable Read Only Memory). But unlike the EEPROM erasable and modifiable at the byte level, the flash memory is erasable and modifiable at the block level, so that performance speed is fast. Such flash memory is currently in use for portable memory apparatus in variety of apparatus including digital cellular phone, digital camera, LAN (Local Area Network) switch, PC card, and digital setup box or inner controller for notebook computer. Furthermore, as memory capacity has been remarkably increased recently, even the flash memory of giga byte capacity is put on the market and actively in use.

In the meantime, an USB port (Universal Serial Bus port) is one of serial ports drawing attention with introduction of Windows 98, operating system for a computer. The USB port plays a role of plug and play interfacing between computer and peripheral devices such as audio player, joystick, keyboard, telephone, scanner, printer, or between computer and flash memory. In relation to the flash memory, the computer could read data stored in the flash memory through such USB port or could record necessary data on the flash memory.

In the meantime, the flash memory apparatus of the related art has a cover for protecting the USB port to prevent the USB port from being damaged or to prevent alien substances from penetrating into the USB port. FIG. 1a and FIG. 1b are front views showing keeping and usage status for the flash memory apparatus having a separation type cover of the prior art. As shown in FIG. 1a and FIG. 1b, the flash memory apparatus having the separation type cover of the prior art, roughly consists of a flash memory main body 10 for receiving a memory element (not shown) in its inside, and a cover 20. Additionally, an USB terminal piece 11 electrically connected with the memory element in the inside and joined to the USB port, is projected from the front end of the memory main body 10, and a front end closely joining part 12 of a predetermined length, where the cover 20 is forcibly fit in and confined therein, is formed on the periphery of the USB terminal piece 11. A fixing threshold 13 for preventing the cover 20 from being inserted further, is formed at the rear end of the front end of the closely joining part 12.

Also, a terminal closely joining part 14 of a predetermined length, where the cover 20 is forcibly fit in and confined therein, is formed also at the terminal of the memory main body 10, and a fixing threshold 13 for preventing the cover 20 from being moved forward further, is formed at the front end of the terminal closely joining part 14.

With the flash memory apparatus provided with the separation type cover having the foregoing construction in case of using the flash memory apparatus, a 25 user applies force on the cover 20 tit in the front end closely joining part 12, for enclosing the USB terminal piece 11 in order to expose the USB terminal piece 11, and then joins the exposed USB terminal piece 11 to the USB port of the computer. A user may insert the separated cover 20 to the terminal closely joining part 14, temporarily keeping the same so that the separated cover 20 is not lost. In case that using the flash memory is completed, a user separates the cover 20 inserted in the terminal closely joining part 14, and keeps the flash memory apparatus with the cover 20 inserted in the front end closely joining part 12.

But, according to the flash memory apparatus having the separation type cover of the prior art as described above, a user may not put the cover on the front end or terminal closely joining part, but may put the cover elsewhere, whereby the cover is lost. In the meantime, situations frequently occur wherein the status of the joint between the USB terminal piece and the front end closely joining part, or the terminal of the closely joining part, loosens so that the cover is detached from the USB terminal piece. In that case, the USB terminal portion of the flash memory apparatus may be damaged or an alien substance may enter the USB terminal piece.

SUMMARY OF THE INVENTION

To solve the above identified problems, it is an object of the present invention to provide a flash memory apparatus having a single body type rotary cover, wherein a cover is not completely separated from the main body during use so that loss of the cover is prevented.

The foregoing and other objects and advantages are realized by providing a flash memory apparatus having a single body type, rotary cover including: a flash memory main body including a rectangular shaped case within which a memory element is mounted with an USB terminal piece electrically connected with the memory element and installed at a front end of the case in a projecting manner. A hinge protuberance is foamed on at least one side of the case. A pair of parallel plate members facing each other with an interval corresponding to the thickness of the case defines a cover having an open front end. The cover has a closed rear end and lateral sides which are open. The parallel plate members have a at least one hinge hole receiving the hinge protuberance for allowing the cover to pivot on the case, so that the cover is rotated with respect to the flash memory main body, whereby the USB terminal piece is received in an inner space of the cover or exposed outside the cover.

BRIEF DESCRIPTION OF THE DRAWINGS

The above objects, features and advantages of the present invention will become more apparent from the following detailed description when taken in conjunction with the accompanying drawings, in which:

FIG. 1a and FIG. 1b are front views showing keeping and usage status for a flash memory apparatus having a separation type cover of the prior art;

FIG. 2 is an exploded, perspective view of a flash memory apparatus having a single body type, rotary cover according to the present invention;

FIG. 3a and FIG. 3b are perspective views showing keeping and usage status, respectively, for a flash memory apparatus having a single body type rotary cover according to a preferred embodiment of the present invention; and FIG. 4 is a schematic cross-sectional view for a portion, taken along line A—A of FIG. 3a.

DETAILED DESCRIPTION OF THE PREFERRED EMBODIMENT

A preferred embodiment of the present invention will now be described with reference to the accompanying drawings.

In the following description, the same drawing reference numerals are used for the same elements in different drawings.

FIG. 2 is an exploded, perspective view of a flash memory apparatus having a single body type rotary cover of the present invention. FIG. 3a and FIG. 3b are perspective views showing storage and usage status for a flash memory apparatus having a single body type rotary cover according to a preferred embodiment of the present invention. FIG. 4 is a schematic cross-sectional view of the portion, taken along line A—A of FIG. 3a. As shown in FIG. 2 through FIG. 4, the flash memory apparatus having a single body type rotary cover of the present invention, includes a flash memory main body 30 and a cover 40 integrally joined to the flash memory main body 30. A case 31 for such flash memory main body 30 is of a rectangular shape having a width wider than its thickness. Additionally, a memory element (not shown) is received in the interior of the case. Also, an USB terminal piece 32, electrically connected with the memory element and joined to an USB port of a computer, is projected from a front end of the case 31. A hinge protuberance 33 for functioning as a rotation shaft of a cover 40 is provided on an appropriate position of a front side and a rear side of the case 31. Such hinge protuberance 33 may be formal integrally with the case 31, or may be manufactured in form of a separate element so that the hinge protuberance 33 is assembled by means of an adhesive agent (The present embodiment shows the latter case). Also, a closely joining protuberance 35 for fixing the cover 40 in a forcibly fitting manner upon storage as described in the following description is formed on one lateral side of the case 31.

The cover 40 has a cavity therein and is of a shape having width wider than its thickness, namely 'U' shaped, when viewed laterally. The cover 40 has open end and a closed end. Adjacent to its open end the cover has a circular hinge hole 41 for receiving the hinge protuberance 33 formed on the flash memory main body 30. Furthermore, a hooking groove 34 is preferably formed on the lower periphery of the hinge protuberance 33. A hooking threshold 45 is hooked on the hooking groove 34 and is preferably formed on a rim confining the hinge hole 41 in order to prevent the hinge hole 41 from being easily detached from the hinge protuberance 33 after joining of the hinge hole 41 and the hinge protuberance 33. In that case, the upper portion of the hooking groove 34 is tapered such that its top is narrow and its bottom is wide so that the hooking threshold 45 is smoothly inserted into the hooking groove 34. The inner edge in the lower part of the hooking threshold 45 that comes into contact with the upper portion of the hooking groove 34 upon insertion is preferably rounded.

The length from the center of the hinge hole 41 of the cover 40 to the closed terminal should be longer than the length from the center of the hinge protuberance 33 of the flash memory main body 30 to the terminal end. Additionally, the width of the cover 40 is preferably about the same as that of the case 31 or a little wider. At least one side of the cover 40 should be opened so that the flash memory main body 30 is allowed to go in and out of the cover 40. One part of the other side, however, is preferably closed in order to prevent alien substances from penetrating into the interior of the cover 40. The aforementioned one part is referred to "closing part 43", and the opened part is referred to "fixing groove 42" hereinafter. For a close joint the protuberance 35 is fixed in the opened part in a force fit upon storing of the flash memory main body 30 in the cover 40.

In case the flash memory main body 30 is stored by the foregoing stricture, the closely joining protuberance 35 is tightly joined to the fixing groove 42 with the flash memory main body 30 received in the interior of the cover 40 as shown in FIG. 3a. Therefore, as long as more than a predetermined external force is not applied, the status that the flash memory main body 30 is received in the interior of the cover 40, is stored as is. Of course, in that status, the flash memory main body 30 is not rotated within the cover 40 by the closing part.

When it is intended to use the flash memory apparatus in storage within the cover 40, a user holds the cover and rotates the flash memory main body 30 in an arrow direction as indicated in FIG. 3a so as to expose the USB terminal piece 32 as shown in FIG. 3b. With such exposed status, a user connects the USB terminal piece 32 to the USB port of the computer.

While the invention has been shown and described with reference to certain preferred embodiments thereof, it will be understood by those skilled in the art that various changes in form and details may be made therein without departing from the spirit and scope of the invention as defined by the appended claims.

For example, the function of the closely joining protuberance 35 formed on the flash memory main body 30, could be realized on an appropriate position in a front or a rear side. In that case, position of the fixing groove 42 formed on the cover 40 will be changed correspondingly. Also, the hinge protuberance could he formed on the cover and the hinge hole could be formed on the flash memory main body. Furthermore, the hinge protuberance could be formed on only one side between the front and the rear sides of the case, and also, only one hinge hole for receiving the hinge protuberance could be provided to the cover.

As is apparent from the foregoing description, according to the flash memory apparatus having the single body type rotary cover of the present invention, the cover is confined to the flash memory main body, so that there is no possibility that the cover is lost and the USB terminal piece is damaged, whereby durability of the flash memory apparatus is improved.

What is claimed is:

1. A flash memory apparatus comprising:
   a flash memory main body including a rectangular shaped case within which a memory element is mounted, an USB (Universal Serial Bus) terminal piece electrically connected with the memory element and installed at a front end of the case in a projecting manner, and a hinge protuberance formed on at least one side of the case; and
   a cover including pair of parallel plate members facing each other and spaced by an interval corresponding to the thickness of the case, the cover having an open front end and a closed rear end with a pair of lateral side openings; the parallel plate members having at least one hinge hole receiving the hinge protuberance on the case for pivoting the case with respect to the flash memory main body, whereby the USB terminal piece is received in an inner space of the cover or exposed outside the cover.

2. The apparatus according to claim 1, wherein a reception maintaining arrangement is provided on the flash memory main body and the cover wherein when the USB terminal piece is received in an inner space of the cover, the main body is maintained within the inner space of the cover.

3. The apparatus according to claim 2, wherein the reception maintaining portion includes a fixing groove formed by partially closing one side of the cover and a joining protuberance formed on one lateral side of the case, the joining protuberance being maintained in the fixing groove by a force fit when the LSB terminal piece is received in the inner space of the cover.

4. The apparatus as in claim 1, wherein a hooking groove is formed on a lower periphery of the hinge protuberance and a hooking threshold for being hooked on the hooking groove upon joining of the hinge protuberance and the hinge hole, is formed on a lower portion of a rim confining the hinge hole.

5. The apparatus as in claim 2, wherein a hooking groove is formed on a lower periphery of the hinge protuberance and a hooking threshold for being hooked on the hooking groove upon joining of the hinge protuberance and the hinge hole, is formed on a lower portion of a rim confining the hinge hole.

6. The apparatus as in claim 3, wherein a hooking groove is formed on a lower periphery of the hinge protuberance and a hooking threshold for being hooked on the hooking groove upon joining of the hinge protuberance and the hinge hole, is formed on a lower portion of a rim confining the hinge hole.

7. A flash memory apparatus comprising:
   a flash memory main body including a case within which a memory element is mounted, an USB (Universal Serial Bus) terminal piece electrically connected with the memory elementand installed at a front end of the case in a projecting manner, and at least one first hinge element formed on at least one side of the case; and
   a cover including pair of parallel plate members facing each other and spaced by an interval corresponding to the thickness of the case, the cover having an open front end and a closed rear end with a pair of lateral side openings; the parallel plate members having at least one second hinge element cooperating with the first hinge element of the case for pivoting the case with respect to the flash memory main body, whereby the USB terminal piece is received in an inner space of the cover or exposed outside the cover.

8. A flash memory apparatus comprising:
   a flash memory main body including a case within which a memory element is mounted, an USB (Universal Serial Bus) terminal piece electrically connected with the memory element and installed at a front end of the case in a projecting manner; and
   a cover including a pair of parallel plate members facing each other and spaced by an interval corresponding to the thickness of the case, the cover having an open front end, a closed rear end and a pair of lateral side openings; the parallel plate members defining an inner space receiving the case and being hinged to the case wherein the USB terminal piece is positioned within the inner space of the cover or exposed outside the cover by rotating the cover and case with respect to one another.

9. The apparatus according to claim 8, wherein a reception maintaining arrangement is provided on the flash memory main body and the cover and wherein when the USB terminal piece is received in an inner space of the cover, the main body is maintained within the inner space of the cover.

10. The apparatus according to claim 9, wherein the reception maintaining portion includes a fixing groove formed by partially closing one side of the cover and a joining protuberance formed on one lateral side of the case, the joining protuberance being maintained in the fixing groove by a force fit when the USB terminal piece is received in the inner space of the cover.

11. The apparatus according to claim 8 wherein the cover and case are hinged by a hinge protuberance on at least one side of the case and at least one hinge hole in one of the parallel plate members that receives the hinge protuberance.

12. The apparatus of claim 11 wherein there is a hinged protuberance on a front side and a back side of the case and a hinge hole in each of the parallel plate members.

13. The apparatus as in claim 11, wherein a hooking groove is formed on a lower periphery of the hinge protuberance, and a hooking threshold for being hooked on the hooking groove upon joining of the hinge protuberance and the hinge hole is formed on a lower portion of a rim confining the hinge hole.

14. The apparatus according to claim 11, wherein a reception maintaining arrangement is provided on the flash memory main body and the cover and wherein when the USB terminal piece is received in an inner space of the cover, the main body is maintained within the inner space of the cover.

15. The apparatus according to claim 14, wherein the reception maintaining portion includes a fixing groove formed by partially closing one side of the cover and a joining protuberance formed on one lateral side of the case, the joining protuberance being maintained in the fixing groove by a force fit when the USB terminal piece is received in the inner space of the cover.

16. The apparatus according to claim 8 wherein the case in rectangular-like.

17. The apparatus according to claim 8 wherein the front end of the case has a curved shape.

18. The apparatus according to claim 8 wherein the end of the case opposite the front end has a curved shape.

19. The apparatus according to claim 17 wherein the end of the case opposite the fornt end has a curved shape.

20. The apparatus according to claim 8 wherein the front end of the cover has a curved shape.

21. The apparatus according to claim 8 wherein the rear end of the cover has a curved shape.

22. The apparatus according to claim 20 wherein the rear end of the cover has a curved shape.

23. The apparatus of claim 19 wherein both the front end and the rear end of both the case and cover have curved shapes.

24. A flash memory apparatus comprising:
   a flash memory main body including a case comprising a memory element, a USB (Universal Serial Bus) terminal piece operatively connected with the memory element at a front end of the case and a hinge element formed on at least one side of the case; and
   a cover including a pair of parallel plate members facing each other and spaced by an interval corresponding to the thickness of the case, the cover having an open front end with a pair of lateral side openings; the parallel plate members having at least one hinge element which cooperates with the hinge element on the case for pivoting the case with respect to the flash memory main body, whereby the USB terminal piece is received in an inner space of the cover or exposed outside the cover.

* * * * *

UNITED STATES PATENT AND TRADEMARK OFFICE
CERTIFICATE OF CORRECTION

PATENT NO. : 6,926,544 B2  Page 1 of 1
DATED : August 9, 2005
INVENTOR(S) : Jung-Woo Lee It is certified that error appears in the above-identified patent and that said Letters Patent is hereby corrected as shown below:

Title page,
Item [30], Foreign Application Priority Data, reads "20-2002-0016582" should read -- 30-2002-0016582 --.

Column 4,
Line 44, reads "mounted, an" should read -- mounted, a --.
Line 50, reads "including pair" should read -- including a pair --.

Column 5,
Line 3, reads "LSB terminal" should read -- USB terminal --.
Lines 25 and 43, reads "mounted, an USB" should read -- mounted, a USB --.
Line 27, reads "elementand" should read -- element and --.
Line 30, reads "including pair" should read -- including a pair --.

Column 6,
Line 31, reads "in rectangular-like." should read -- is rectangular-like. --.
Line 37, reads "the fornt end" should read -- the front end --.

Signed and Sealed this

Twenty-first Day of March, 2006

JON W. DUDAS
*Director of the United States Patent and Trademark Office*